United States Patent
Ashman et al.

[11] Patent Number: 6,142,831
[45] Date of Patent: Nov. 7, 2000

[54] MULTIFUNCTION CONNECTOR ASSEMBLY

[75] Inventors: John J. Ashman, Murrells Inlet; Brian J. Williams, Conway, both of S.C.

[73] Assignee: AUX Corporation, Myrtle Beach, S.C.

[21] Appl. No.: 09/241,005

[22] Filed: Feb. 1, 1999

[51] Int. Cl.[7] .......................... H01R 13/66; H01R 33/945
[52] U.S. Cl. ............................................. 439/620; 439/607
[58] Field of Search .................................. 439/620, 607, 439/95, 79, 289

[56] References Cited

U.S. PATENT DOCUMENTS

| | | |
|---|---|---|
| 4,589,720 | 5/1986 | Ajula et al. . |
| 4,703,984 | 11/1987 | Mitchell, Jr. . |
| 4,726,790 | 2/1988 | Hadjis . |
| 4,729,743 | 3/1988 | Farrar et al. . |
| 4,781,624 | 11/1988 | Shepherd . |
| 4,804,332 | 2/1989 | Pirc . |
| 4,820,174 | 4/1989 | Farrar et al. . |
| 4,929,196 | 5/1990 | Ponn et al. . |
| 5,057,041 | 10/1991 | Yu et al. . |
| 5,094,629 | 3/1992 | Black et al. . |
| 5,102,354 | 4/1992 | Crane et al. . |
| 5,112,253 | 5/1992 | Swift . |
| 5,147,223 | 9/1992 | Black et al. . |
| 5,149,274 | 9/1992 | Gallusser et al. . |
| 5,151,054 | 9/1992 | Briones et al. . |
| 5,152,699 | 10/1992 | Pfeifer . |
| 5,158,482 | 10/1992 | Tan et al. . |
| 5,213,522 | 5/1993 | Kojima . |
| 5,224,878 | 7/1993 | Lurie et al. . |
| 5,246,387 | 9/1993 | Liebich et al. . |
| 5,266,054 | 11/1993 | Duncan et al. . |
| 5,286,221 | 2/1994 | Fencl et al. . |
| 5,344,342 | 9/1994 | Briones . |
| 5,397,250 | 3/1995 | Briones . |
| 5,415,569 | 5/1995 | Colleran et al. . |
| 5,513,065 | 4/1996 | Caveney et al. . |
| 5,624,277 | 4/1997 | Ward . |
| 5,647,767 | 7/1997 | Scheer et al. . |
| 5,686,697 | 11/1997 | Miller et al. . |
| 5,704,810 | 1/1998 | Shimasaki . |
| 5,865,648 | 2/1999 | Clyatt, III . |

*Primary Examiner*—Renee Luebke
*Assistant Examiner*—Antoine Ngandjui
*Attorney, Agent, or Firm*—Dority & Manning, P.A.

[57] ABSTRACT

An electrical connector includes electronic components within the connector body to provide integrated filtering to elongate contact elements extending therethrough. Toward this end, the connector body defines a receiving area in which a component subassembly is located. The component subassembly includes an insulative cartridge defining a plurality of component holes. A planar terminal element, such as a common ground plane element, is juxtaposed to the insulative cartridge. A plurality of electronic components, such as capacitors, are located respectively in the component holes.

26 Claims, 9 Drawing Sheets

MULTIFUNCTION CONNECTOR ASSEMBLY

BACKGROUND OF THE INVENTION

The present invention relates generally to the art of electrical connectors. More particularly, the invention relates to connectors having integrated filtering components, such as capacitors.

Electrical connectors are widely used in communication, data processing or other electronic systems. Typically, such connectors include an insulative housing which mounts a plurality of elongate contact elements. When configured as a "socket," the connector will often be mounted onto a suitable substrate, such as a circuit board. The corresponding "plug" is adapted to rapidly interconnect with the socket.

It is often desirable to filter circuit paths of the respective contact elements in order to remove interference and other extraneous electrical signals. In some arrangements, filtering has been achieved by providing capacitors or other filtering components on the circuit board to which the connector socket is mounted. While generally effective, these arrangements have often been considered undesirable in part due to the circuit board "real estate" taken up by the filtering components.

Alternatively, capacitors or other filtering components have been incorporated into the connector body. While these arrangements may provide additional "real estate" on the circuit board, they have not been without disadvantages. For example, arrangements of this type have often been difficult to assemble or otherwise configure to achieve the desired filtering function. Such difficulties may be exacerbated by an incompatibility between connector housings having different external configurations.

SUMMARY OF THE INVENTION

The present invention recognizes various disadvantages of prior art constructions and methods. Accordingly, it is an object of the present invention to provide novel electrical connector devices.

It is a further object of the present invention to provide novel electrical connectors having integrated filtering components.

It is a further object of the present invention to provide electrical connectors using a unique component subassembly located in the connector body.

It is a still further object of the present invention to provide electrical connectors configured to realize various circuit arrangements within the connector.

It is a still further object of the present invention to provide a component subassembly incorporating a planar terminal element.

It is an additional object of the present invention to provide a novel method of manufacturing component subassemblies for use in a connector body.

Some of these objects are achieved by an electrical connector comprising a connector body defining a subassembly receiving area. A plurality of elongate contact elements extend through the connector body. A component subassembly is located in the subassembly receiving area of the connector body. In some exemplary embodiments, the contact elements may comprise a tail portion for connection to conductive traces on a substrate to which the electrical connector is mounted.

The component subassembly includes an insulative cartridge defining a plurality of component holes. A planar terminal element is juxtaposed to the insulative cartridge. In addition, a plurality of electronic components are located respectively in the component holes. Often, the electronic components will be capacitor devices, transient suppression devices, inductor devices, resistor devices or fuses.

In some exemplary embodiments, one terminal of each electronic component is directly connected to a respective contact element. Often, the terminal element may comprise a metallic ground plane element to which another terminal of each electronic component is directly connected. The metallic ground plane element may have lateral portions extending beyond the insulative cartridge which are received in slots defined in the connector body.

Alternatively, the terminal element may comprise a circuit board element different from the substrate to which the connector will be mounted. In such embodiments, one or more terminals of each electronic component may be directly connected to a metallic layer on the circuit board element. Preferably, the metallic layer is patterned to provide predetermined circuit connections between respective electronic components.

Other objects of the present invention are achieved by a component subassembly for receipt in a body of an electrical connector. In this case, the component subassembly comprises a metallic ground plane element. An insulative cartridge is also provided, having a top surface and a bottom surface. The insulative cartridge is attached to the ground plane element such that the bottom surface of the insulative cartridge is juxtaposed to the ground plane element. The insulative cartridge further defines therein a plurality of component holes, in which electronic components are respectively located. One terminal of each electronic component is conductively bonded to the ground plane element, such as by a conductive epoxy.

In some exemplary embodiments, another terminal of each electronic component is substantially flush with the top surface of the insulative cartridge. Preferably, the insulative cartridge may include at least one retaining peg received in an associated locating hole defined in the ground plane element. Often, the ground plane element will be configured having a testing tab extending therefrom.

Additional objects of the present invention are achieved by a method of manufacturing component subassemblies for insertion into a body of an electrical connector. One step of the method involves providing an elongate piece of a predetermined metal configured to define a plurality of individual ground plane elements. Insulative cartridges, each defining a plurality of component holes therein, are then placed in juxtaposition to the respective ground plane elements. As an additional step, electronic components are placed in the component holes of the insulative cartridges. One terminal of each electronic component is electrically connected to the ground plane element to form a component subassembly. The ground plane elements may then be separated from the elongate piece to thereby separate the component subassemblies.

Still further objects of the present invention are achieved by an electrical connector comprising a connector body defining a subassembly receiving area. At least one elongate contact element extends through the connector body. A component subassembly is located in the subassembly receiving area of the connector body. The component subassembly includes an insulative cartridge defining at least one component hole therethrough. A metallic ground plane element is juxtaposed to the insulative cartridge. A capacitor device is located in the component hole such that a first polarity terminal thereof is directly connected to the elongate contact element and a second polarity terminal thereof is directly connected to the ground plane element.

Additional objects of the present invention are achieved by an electrical connector comprising a connector body defining a subassembly receiving area. At least one elongate contact element extends through the connector body. A component subassembly is located in the subassembly receiving area of the connector body. The component subassembly includes an insulative cartridge defining at least one component hole therethrough. A planar circuit board element is juxtaposed to the insulative cartridge and has a patterned metallic layer thereon for providing a predetermined connection arrangement. An integrated circuit device is located in the component hole. The integrated circuit device has a first terminal connected to the elongate contact element and a second terminal connected to the patterned metallic layer of the planar circuit board element.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
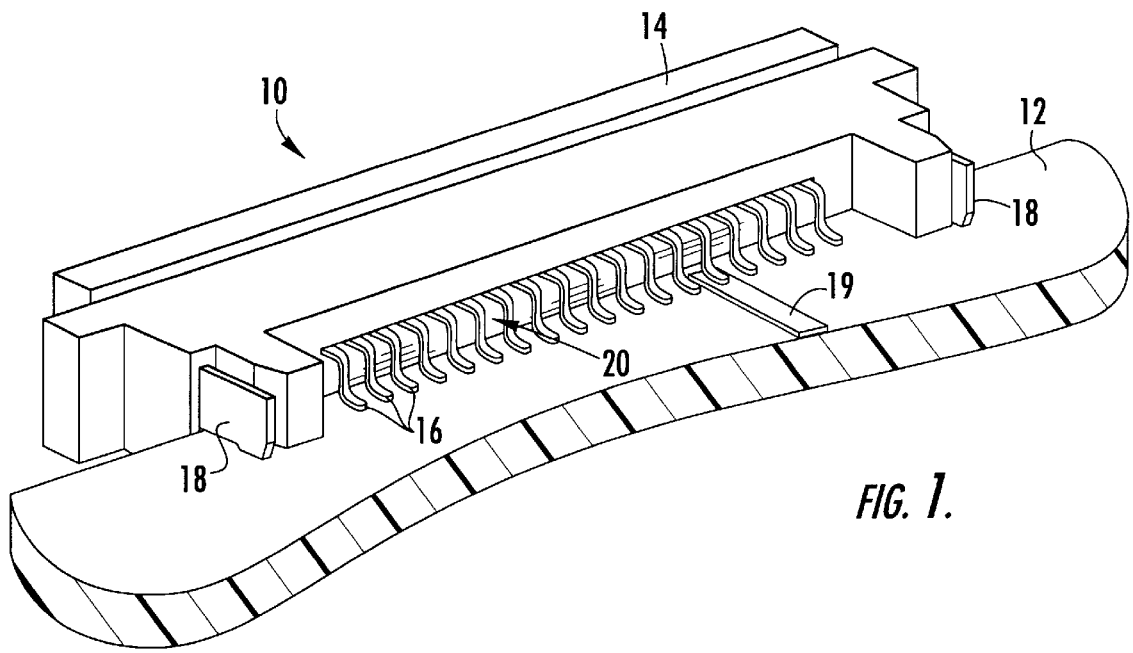
FIG. 1 is a perspective view of an electrical connector constructed in accordance with the present invention, installed on a mounting substrate.

Repeat use of reference characters in the present specification and drawings is intended to represent same or analogous features or elements of the invention.

DETAILED DESCRIPTION OF PREFERRED EMBODIMENTS

It is to be understood by one of skill in the art that the present discussion is a description of exemplary embodiments only, and is not intended as limiting the broader aspects of the present invention, which broader aspects are embodied in the exemplary constructions.

Figure 2:
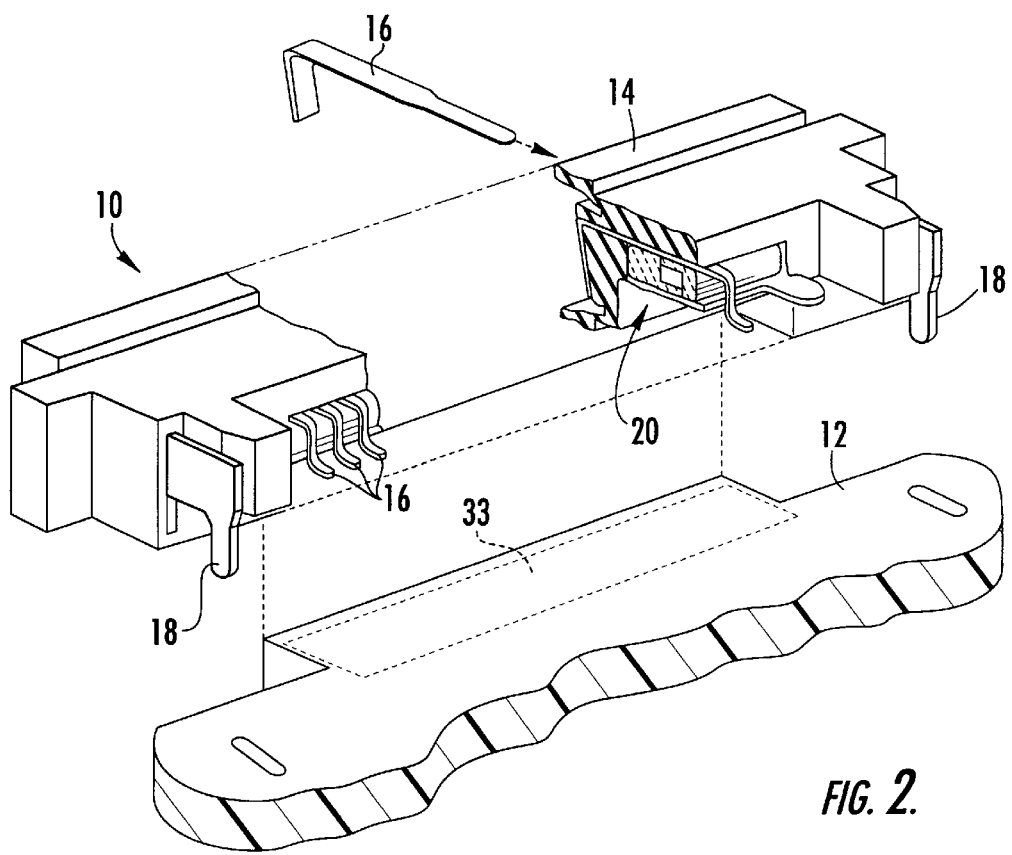
FIG. 2 is an exploded and partially sectional view of the electrical connector of FIG. 1 showing various additional features.

FIGS. 1 and 2 illustrate a multifunction electrical connector 10 constructed in accordance with the present invention. In this case, connector 10 is configured as a "socket" connector mounted to a circuit board 12 or other suitable substrate. Connector 10 has an insulated body 14 through which a plurality of contact elements 16 extend. In the illustrated example, the external configuration of body 14 is similar to a MOBO socket connector manufactured by Elco U.S.A. Inc. of Myrtle Beach, S.C. A pair of locating pins 18 are provided to facilitate mounting of the connector 10 onto circuit board 12. As is typical, circuit board 12 will define appropriate traces, such as trace 19, between respective contact elements 16 and other circuitry.

In order to conserve "real estate" on circuit board 12, connector 10 includes certain filtering components within the confines of body 14. Various techniques for providing integral filtering in a connector of this general type were disclosed in copending and commonly-assigned application Ser. No. 08/784,799, incorporated herein by reference. In order to provide various advantages over the prior art, connector 10 includes a component subassembly 20 in which electronic components are located to perform the desired filtering functions. Component subassembly 20, having the desired filtering components for all of the respective contact elements 16, is conveniently inserted as a unit into a receiving area defined in the back of body 14.

Figure 3:
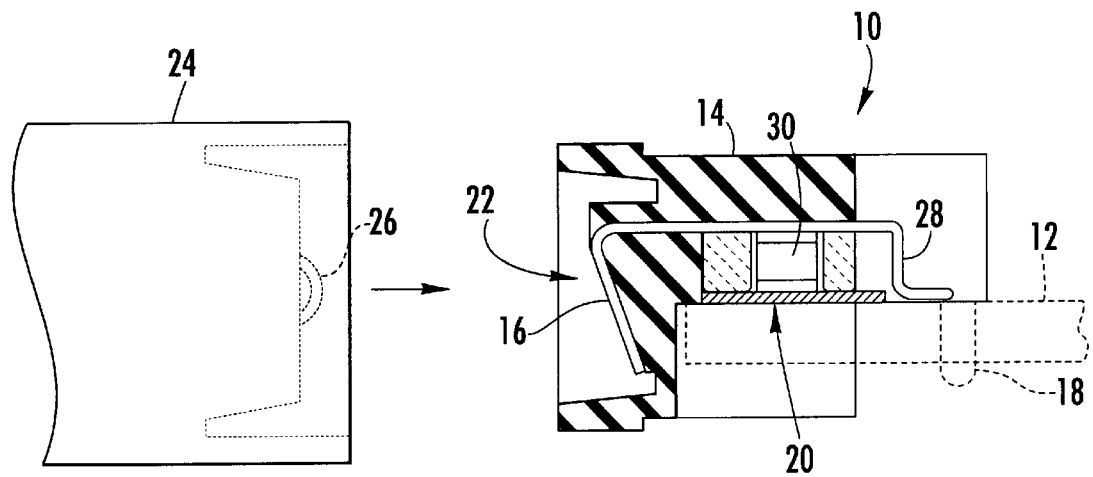
FIG. 3 is an enlarged sectional view of the electrical connector of FIG. 1 showing attachment of an associated plug.

Referring now to FIG. 3, certain additional details of connector 10 can be seen. As shown at 22, contact elements 16 form a "contact bank" at the front of body 14. The front of body 14 is configured to receive a corresponding plug 24, which includes a plurality of spring-loaded contacts 26. When the plug and socket are mated, contacts 26 will engage respective contact elements 16 such that an electrical connection is formed therebetween. In the illustrated example, each contact element 16 includes a tail portion, such as that indicated at 28, extending as shown beyond the back of body 14. The respective tail portions connect with a corresponding trace or other conductor on the surface of circuit board 12.

Figure 4:
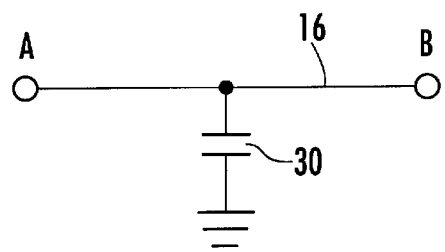
FIG. 4 is a schematic diagram of one filtering function that can realized in the connector of FIG. 1.

An example of a filtering function that can be achieved according to the present invention is shown in FIG. 4. Here, the signal path of a single contact element 16 is shown extending between a pair of nodes, respectively designated "A" and "B." Node A represents the location where contact element 16 engages spring-loaded contact 26, while node B represents the location at which tail portion 28 is connected to a trace on circuit board 12. A capacitor 30 is connected between contact element 16 and ground such that high frequency interference appearing at node A will be "shorted" before being passed on to node B.

Figure 5:
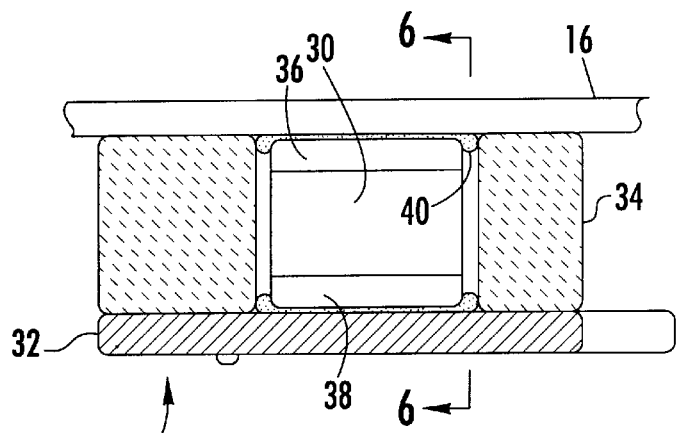
FIG. 5 is an enlarged sectional view of a preferred component subassembly utilized in the electrical connector of FIG. 1.

The construction of component subassembly 20 can be explained with reference to FIGS. 5 and 6. As shown, component subassembly 20 comprises a planar terminal element, such as ground plane element 32, supporting an insulative cartridge 34. Typically, ground plane element 32 will be electrically connected by soldering or the like to a suitable grounding pad 33 (shown in phantom in FIG. 2) defined on the surface of circuit board 12.

Insulative cartridge 34 defines a plurality of component holes into which respective electronic components, such as capacitor 30, are located. Preferably, the electronic components placed in insulative cartridge 34 will be surface-mount electronic components having termination structures at each end thereof. In this case, for example, capacitor 30 is a multilayer ceramic capacitor (MLC) having terminations 36 and 38 at its respective ends.

It can be seen that the height of insulative cartridge 34 is approximately the same as that of capacitor 30. As a result, terminations 36 and 38 can be directly connected to contact element 16 and ground plane element 32, respectively. As indicated at 40, for example, conductive epoxy or solder may be used to directly connect the component terminations in this manner.

Figure 6:
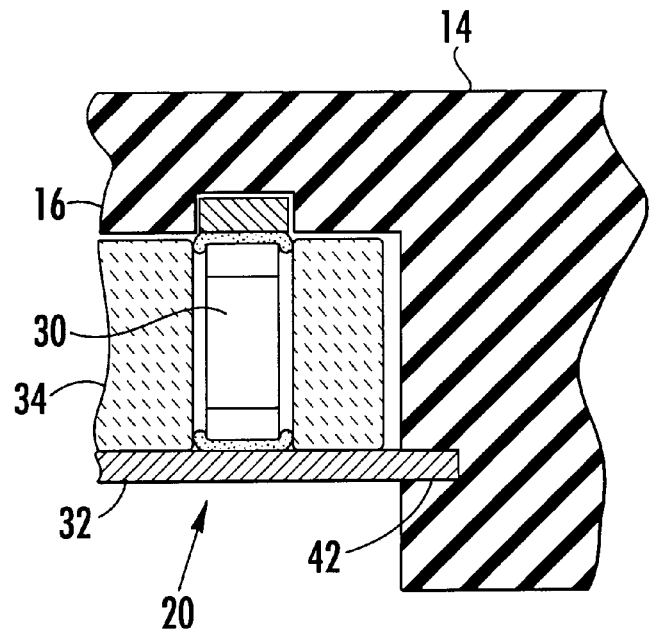
FIG. 6 is an enlarged sectional view of the component subassembly taken along line 6—6 of FIG. 5 and installed in the connector body.

As shown in FIG. 6, ground plane element 32 preferably defines lateral portions, such as lateral portion 42, extending beyond insulative cartridge 34. These lateral portions can be received in corresponding slots defined in connector body 14. As a result, component subassembly 20 will be securely maintained in the receiving area of connector body 14.

As a particular advantage, component subassembly 20 provides a uniform electrical length between all of contact elements 16 and the common ground plane element 32. This is in contrast to many arrangements of the prior art, in which the electrical length, and thus the electrical characteristics, would often differ between various contact elements in the same connector. The use of a common ground plane element also provides a visible termination to the substrate at which solder joints or the like can be easily inspected.

In addition, component subassembly 20 allows the electrical function to be customized to meet the exigencies of a particular application. For example, one contact element 16 may be filtered by a capacitor of a first value, with a capacitor of another value being used with a different contact element 16. Alternatively, different types of electronic components, such as resistors, inductors, transient suppression devices or fuses, can be substituted for some or all of the capacitor devices to provide an even greater variety of circuit functions.

The use of component subassembly 20 also permits various manufacturing efficiencies to be achieved. Specifically, connectors having a variety of different body configurations can be made to receive a standard component subassembly. Thus, a single component subassembly could be used with an entire family of electrical connectors.

Figure 7:
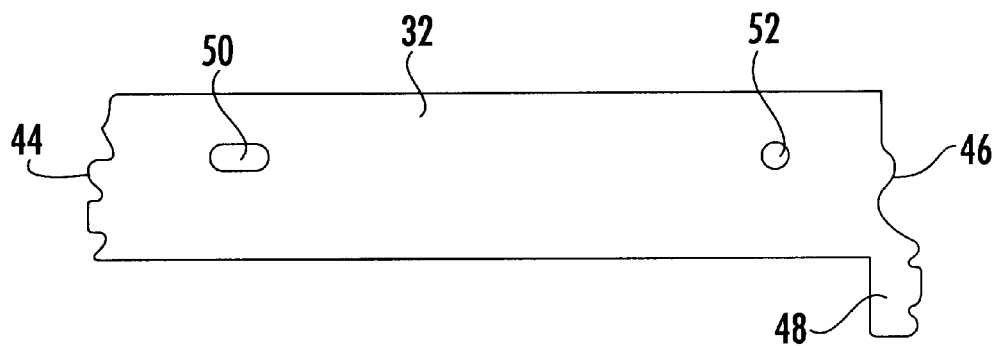
FIG. 7 is a plan view of a metallic ground plane element used in the component subassembly.

Referring now to FIG. 7, a preferred configuration of ground plane element 32 is illustrated. As can be seen, ground plane element 32 is generally elongate in configuration, and has lateral sides 44 and 46 that are somewhat serrated. The serrations further ensure a tight engagement in the slots of connector body 14 when inserted therein as described with respect to FIG. 6.

A testing tab 48 extends from the main portion of ground plane element 32 to provide a reference point at which electrical measurements may be easily made. As shown, ground plane element 32 further defines a pair of locating holes 50 and 52 through which mounting pegs of insulative cartridge 34 extend.

Figure 8A:
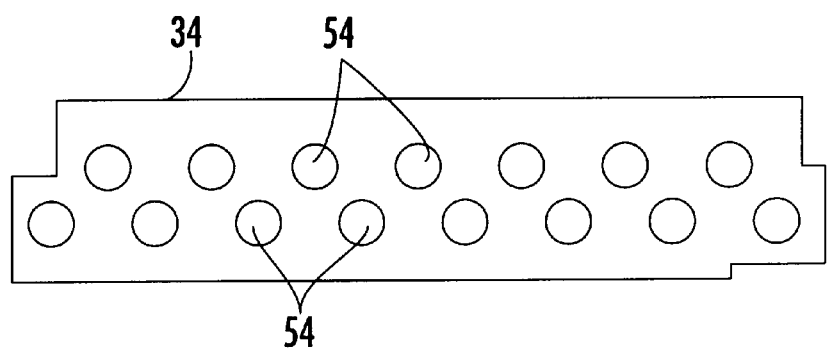
FIGS. 8A and 8B are respective top and bottom plan views of an insulative cartridge used in the component subassembly.
Figure 8B:
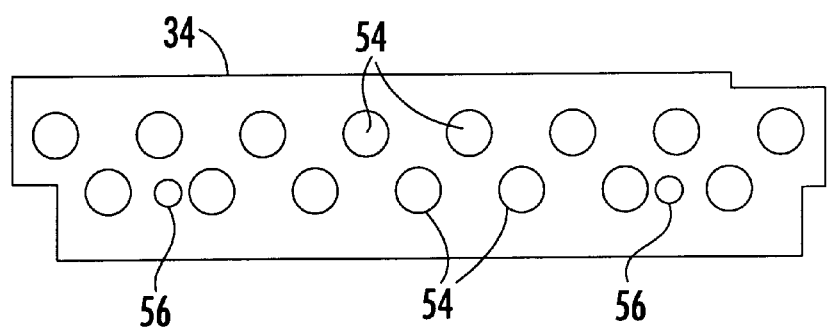

Various details of insulative cartridge 34 may be most easily explained with reference to FIGS. 8A and 8B. In this case, insulative cartridge 34 is formed as a separate piece that is subsequently attached on top of ground plane element 32. The reference number 54 indicates component holes into which the respective electronic components are received.

A pair of mounting pegs 56 are provided on the bottom of insulative cartridge 34 for an interference fit in locating holes 50 and 52 of ground plane element 32. Mounting pegs 56 thus serve to locate and retain insulative cartridge 34 in the correct position. Typically, the epoxy used to form the electrical connection between ground plane element 32 and the respective electrical components may also serve to hold insulative cartridge 34 in the correct position.

Figure 9:
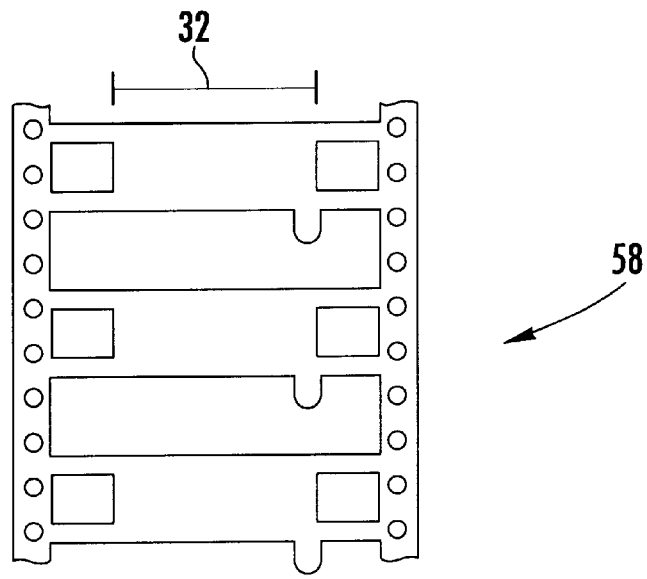
FIG. 9 is a diagrammatic plan view of an elongate metal piece containing a plurality of ground plane elements.
Figure 10:
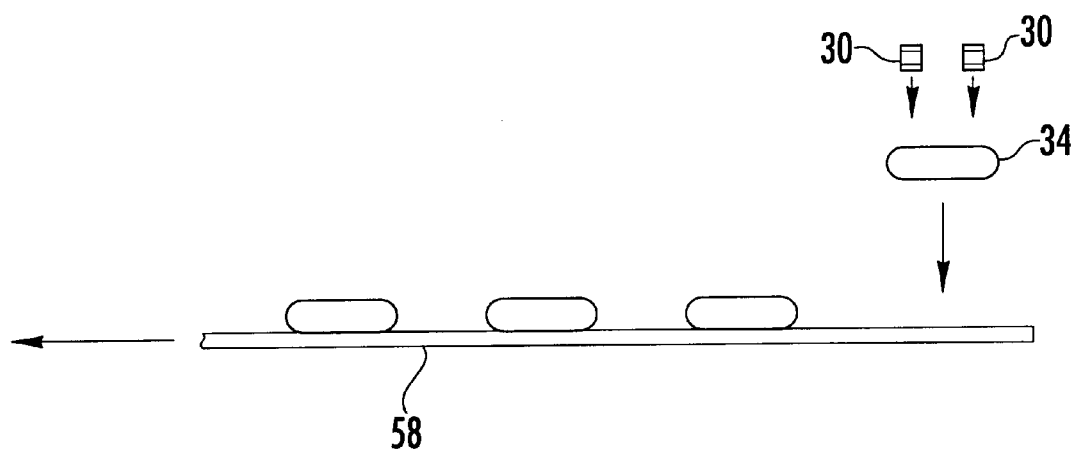
FIG. 10 is a diagrammatic elevational view illustrating a manner in which component subassemblies may be constructed in accordance with the present invention.

One preferred manner by which component subassembly 20 can be manufactured is shown in FIGS. 9 and 10. Referring now to FIG. 9, a plurality of ground plane elements 32 may be integrated into a continuous strip 58 of suitable metal. Strip 58 may be configured such that the respective ground plane elements 32 are formed at predetermined axial positions along its length. Strip 58 may be wound into a reel, and configured as shown to be fed using tractor feed mechanisms known in the art.

In FIG. 10, strip 58 is shown advancing past a location at which the elements of the component subassembly are brought together. At this location, insulative cartridge 34 is placed on a respective ground plane element 32. Individual components, such as capacitors 30, are then inserted into the component holes of the respective insulative cartridge 34. Often, it will then be desirable to heat the entire subassembly to suitably bond the various elements together. The ground plane elements 32 can be subsequently separated from strip 58 to thereby separate the respective component subassemblies.

Figure 11:
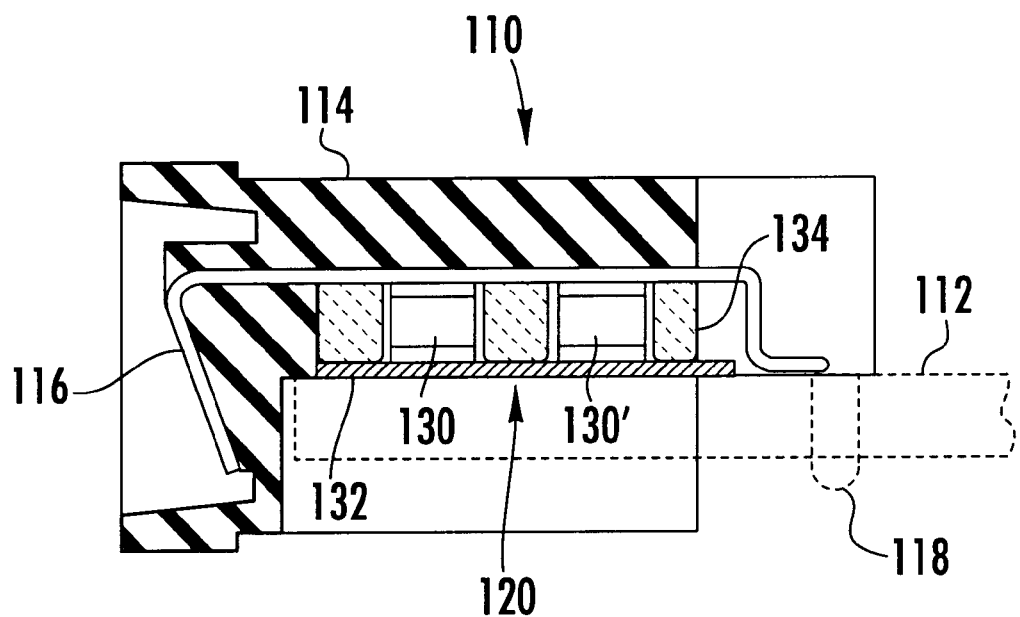
FIG. 11 is an enlarged cross-sectional view of an alternative connector assembly in accordance with the present invention.
Figure 12:
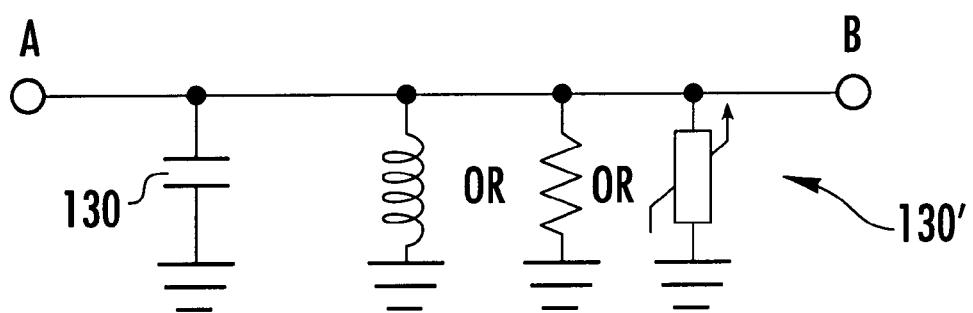
FIG. 12 is a schematic diagram of exemplary filtering functions that can realized in the connector of FIG. 11.

FIG. 11 illustrates an alternative connector 110 which is similar in many respects to connector 10 described above. Accordingly, similar elements will be designated by a reference number augmented by one hundred. In this case, it can be seen that each contact element 116 has a pair of electronic components associated therewith. The first such component, designated by the reference number 130, may be a capacitor as described above. The second component, designated by the reference number 130', may be another type of electronic device, such as an inductor, resistor or transient suppression device. The electrical function achieved in such an arrangement is schematically depicted in FIG. 12.

Figure 13:
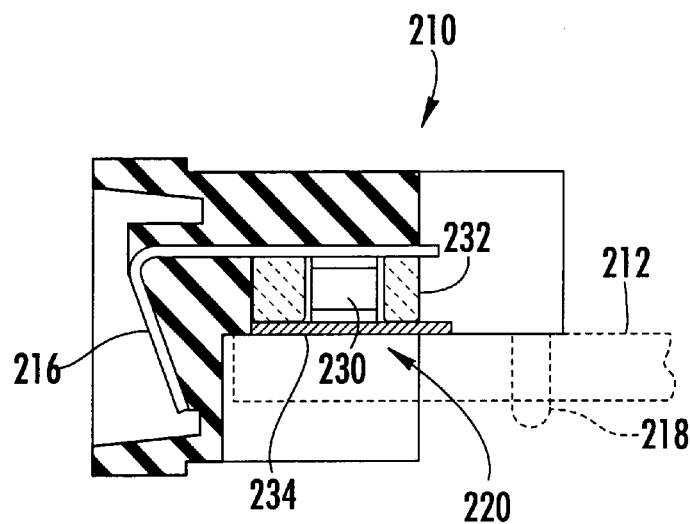
FIG. 13 is an enlarged cross-sectional view of a further alternative connector assembly in accordance with the present invention.
Figure 14:
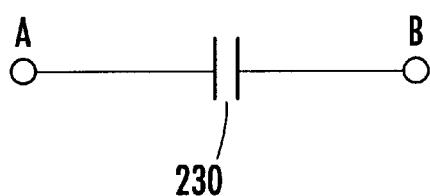
FIG. 14 is a schematic diagram of an exemplary filtering function that can realized in the connector of FIG. 13.
Figure 14A:
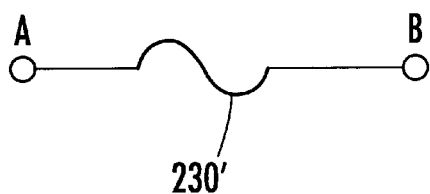
FIG. 14A is a schematic diagram similar to FIG. 14 showing use of a serially-connected fuse element.

A still further alternative is illustrated in FIG. 13, in which components similar or analogous to those of connector 10 are augmented by two hundred. In this case, it can be seen that contact element 216 does not have a tail portion. Thus, ground plane 232 serves as terminal B, leading to a series arrangement as shown in FIG. 14. FIG. 14A illustrates an alternative arrangement where a fuse 230' is employed to prevent current flowing along the circuit path from exceeding a predetermined threshold level.

In some embodiments, it may be desirable to substitute a circuit board element for the metallic ground plane element shown in the above examples. Such an arrangement may be advantageous to perform more complicated interconnect patterns as may be desirable in certain applications. In fact, relatively complex circuit arrangements can be provided in the connector housing for performing a significant variety of electrical functions.

Figure 15:
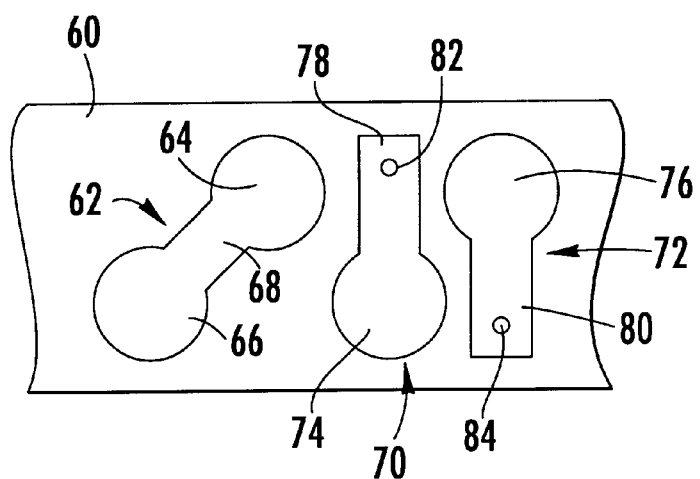
FIG. 15 is a plan view of a portion of a circuit board element that may be utilized in lieu of a metallic ground plane element in some embodiments of the present invention.

FIG. 15 shows an enlarged portion of a circuit board element 60 that may be used in lieu of a metallic ground plane as described above. Circuit board element 60 includes a conductive layer patterned to define metallic traces on its surface. These metallic traces serve to electrically connect selected electronic components located in the component holes of the overlying insulative cartridge.

For example, a trace 62 located on the surface of circuit board 60 connects two of the electronic components together in a series arrangement. Toward this end, each of the two electronic components may be connected to a respective attachment pad 64 and 66 by solder, epoxy or the like. Trace 62 further defines an interconnect 68 by which attachment pads 64 and 66 are electrically connected to each other.

Additional traces 70 and 72 are provided to allow still further circuit functions to be achieved. As shown, traces 70 and 72 include a respective attachment pad 74 and 76 to which one terminal of a respective electronic component is connected. Extension portions 78 and 80 serve to interconnect attachment pads 74 and 76 with via holes 82 and 84, respectively. Via holes 82 and 84 may, for example, connect the electronic component with conductive traces on the underlying substrate. Alternatively, the via holes may provide a connection to additional circuit traces on a bottom surface of circuit board 60, or, in case of a multilayer circuit board, to circuit traces located on an intermediate layer surface.

Figure 16:
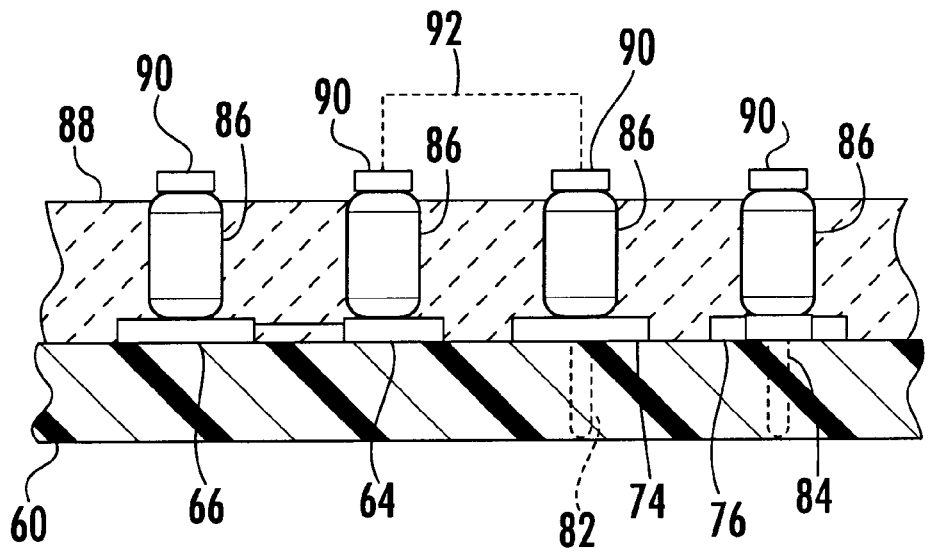
FIG. 16 is a partial cross-sectional view showing a portion of a component subassembly using the circuit board element of FIG. 15.

FIG. 16 illustrates a portion of a component subassembly made with circuit board 60 as the planar terminal element. As shown, a plurality of electrical components 86 are installed in respective component holes of an insulative cartridge 88. Contact elements 90, here of the type without a tail portion, are shown for purposes of illustration in the position they would occupy if the subassembly were installed in the component housing. In this example, the two inner components are electrically connected to one another through the plug, as indicated at 92.

Figure 17:
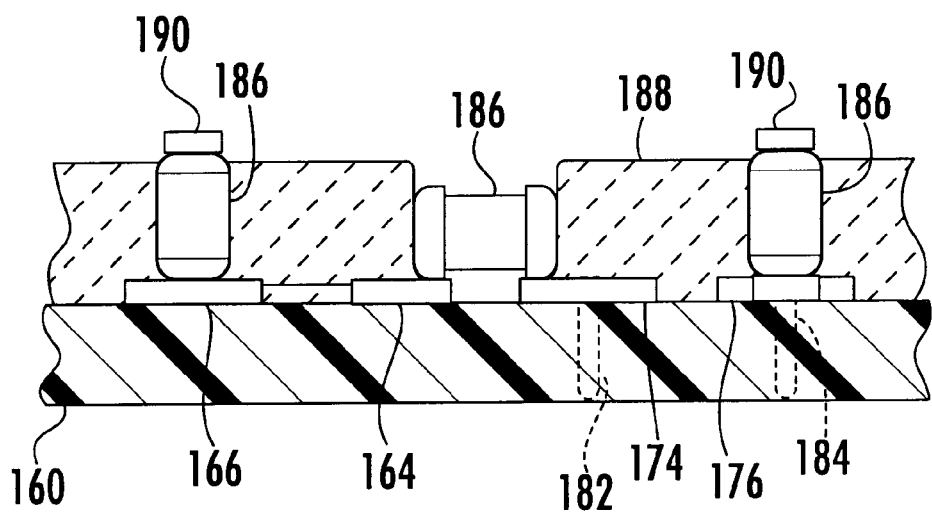
FIG. 17 is a partial cross-sectional view taken along a line similar to that of FIG. 16 and illustrating an alternative circuit arrangement.

An alternative subassembly utilizing a circuit board as the planar terminal element is illustrated in FIG. 17, in which components similar or analogous to those of the embodiment in FIG. 16 are augmented by one hundred. In this case, only two contact elements 190 are provided, instead of four as in the embodiment of FIG. 16. The two contact elements 190 are located in the respective outermost positions such that the two inner positions are not occupied. Accordingly, insulative cartridge 188 is configured to permit the inner component 186 to lie on its side as shown. Both terminations of component 186 are thus connected to conductive traces on circuit board 160.

Figure 18:
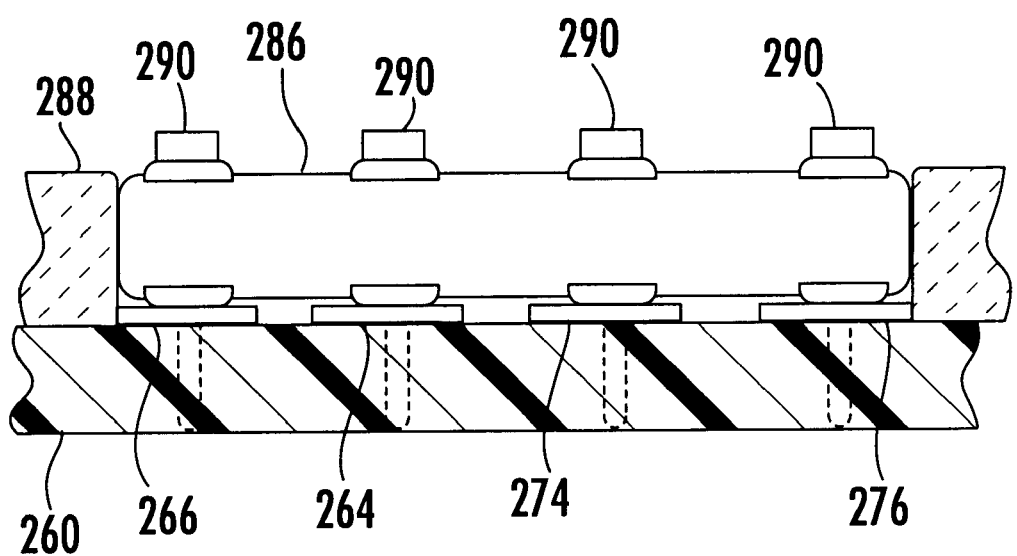
FIG. 18 is a partial cross-sectional view taken along a line similar to that of FIG. 16 and illustrating another alternative circuit arrangement.

A further alternative is illustrated in FIG. 18, in which components similar or analogous to those of the embodiment in FIG. 16 are augmented by two hundred. In this case, a surface mount integrated circuit (IC) chip 286 is located in a relatively large component hole defined in insulative cartridge 288. Contact elements 290 are connected to respective terminations on one lateral side of IC chip 286. Terminations on the opposite lateral side of IC chip 286 are connected to respective attachment pads 264, 266, 274 and 276. As shown, each of the attachment pads is connected to a respective via hole in this case. IC chip 286 may function, for example, to output a predetermined code message upon receipt of a selected input signal along one of the contact elements 290.

It can be seen that the present invention provides an electrical connector device in furtherance of the objects noted above. While preferred embodiments of the invention have been shown and described, modifications and variations may be made thereto by those of ordinary skill in the art without departing from the spirit and scope of the present invention. For example, in may be desirable to form the insulative cartridge of the component subassembly directly on top of the planar terminal element by comolding techniques, instead of forming it separately as described above.

It should also be understood that aspects of the various embodiments may be interchanged both in whole or in part. For example, several of the contact elements in a single component subassembly may be connected to individual components, while others are connected to one or more IC chips installed in the same subassembly. In addition, those of ordinary skill in the art will appreciate that the foregoing description is by way of example only, and is not intended to be limitative of the invention set forth in the appended claims.

What is claimed is:

1. An electrical connector comprising:
   a connector body defining a subassembly receiving area;
   a plurality of elongate contact elements extending through said connector body;
   a component subassembly located in said subassembly receiving area of said connector body, said component subassembly including:
   (a) an insulative cartridge defining a plurality of component holes for receipt of electronic components, the insulative cartridge having edges and a top longitudinally extending surface and a bottom longitudinally extending surface;
   (b) a planar terminal element juxtaposed to said insulative cartridge;
   (c) a plurality of electronic components located respectively in said component holes and the electronic components being selected from a group consisting of capacitors, transient suppression devices, inductors, resistors and fuses;
   (d) wherein said insulative cartridge extends longitudinally in a plane between said contact elements and said planar terminal element such that said electronic components carried in said component holes are disposed generally-transverse to and in contact with said contact elements and said planar terminal elements.

2. An electrical connector as set forth in claim 1, wherein said terminal element comprises a metallic ground plane element having lateral portions extending beyond said insulative cartridge, said lateral portions being received in slots defined in said connector body.

3. An electrical connector as set forth in claim 1, wherein said terminal element comprises a circuit board element having a patterned metallic layer thereon for providing a predetermined connection arrangement to said electronic components.

4. An electrical connector as set forth in claim 1, wherein each of said contact elements comprises a tail portion for connection to conductive traces on a substrate to which said electrical connector is mounted.

5. An electrical connector as set forth in claim 1, wherein said electronic components include capacitor devices.

6. An electrical connector as set forth in claim 1, wherein said electronic components are selected from a group consisting of transient suppression devices, inductor devices, resistor devices and fuses.

7. An electrical connector as set forth in claim 1, wherein one terminal of each said electronic component is directly connected to a respective of said contact elements.

8. An electrical connector as set forth in claim 7, wherein said terminal element comprises a circuit board element, another terminal of each said electronic component being directly connected to a metallic layer on said circuit board element.

9. An electrical connector as set forth in claim 7, wherein said terminal element comprises a metallic ground plane element, another terminal of each said electronic component being directly connected to said ground plane element.

10. An electrical connector as set forth in claim 9, wherein said metallic layer on said circuit board element is patterned to provide predetermined circuit connections between respective of said electronic components.

11. A component subassembly for receipt in a body of an electrical connector, said component subassembly comprising:
- a metallic ground plane element;
- an insulative cartridge having edges and a top longitudinally extending surface and a bottom longitudinally extending surface, said insulative cartridge further defining a plurality of component holes;
- said insulative cartridge being attached to said ground plane element such that said bottom surface of said insulative cartridge is juxtaposed to said ground plane element;
- a plurality of electronic components located respectively in said component holes of said insulative cartridge the electronic components being selected from the group consisting of capacitors, transient suppression devices, inductors, resistors, and fuses; and
- one terminal of each said electronic component being conductively bonded to said ground plane element.

12. A component subassembly as set forth in claim 11, wherein said electronic components include capacitor devices.

13. An electrical connector as set forth in claim 11, wherein said electronic components include transient suppression devices.

14. An electrical connector as set forth in claim 11, wherein said electronic components include inductor devices.

15. An electrical connector as set forth in claim 11, wherein said electronic components include resistor devices.

16. An electrical connector as set forth in claim 11, wherein said electronic components include fuse devices.

17. A component subassembly as set forth in claim 11, wherein said ground plane element has lateral portions extending beyond sides of said insulative cartridge.

18. A component subassembly as set forth in claim 11, wherein another terminal of each said electronic component is substantially flush with said top surface of said insulative cartridge.

19. A component subassembly as set forth in claim 18, wherein said insulative cartridge includes at least one retaining peg received in an associated locating hole defined in said ground plane element.

20. A component subassembly as set forth in claim 18, wherein said one terminal of each said electronic component is conductively bonded to said ground plane element utilizing a conductive epoxy.

21. A component subassembly for receipt in a body of an electrical connector, said component comprising:
- a metallic ground plane element;
- an insulative cartridge having a top surface and a bottom surface, said insulative cartridge further defining a plurality of component holes;
- said insulative cartridge being attached to said ground plane element such that said bottom surface of said insulative cartridge is juxtaposed to said ground plane element;
- a plurality of electronic components located respectively in said component holes of said insulative cartridge;
- one terminal of each said electronic component being conductively bonded to said ground plane element; and
- wherein said ground plane element has a testing tab extending therefrom.

22. A method of manufacturing component subassemblies for insertion into a body of an electrical connector, said method comprising steps of:
(a) providing an elongate piece of a predetermined metal configured to define a plurality of individual ground plane elements;
(b) placing respective insulative cartridges in juxtaposition to each of said ground plane elements, said insulative cartridges defining a plurality of component holes therein oriented generally transverse to said ground plane element, the insulative cartridge having edges and a top longitudinally extending surface and a bottom longitudinally extending surface;
(c) inserting respective electronic components in said cartridge holes, the electronic components being selected from a group consisting of capacitors, transient suppression devices, inductors, resistors and fuses; and
(d) electrically connecting one terminal of each of said electronic components to said ground plane element to form said component subassemblies.

23. A method as set forth in claim 22, wherein said ground plane elements are separated from said elongate piece to thereby separate said component subassemblies.

24. A method as set forth in claim 23, wherein each of said component subassemblies are inserted into a subassembly receiving area defined in a respective connector body.

25. An electrical connector comprising:
- a connector body defining a subassembly receiving area;
- at least one elongate contact element extending through said connector body;
- a component subassembly located in said subassembly receiving area of said connector body, said component subassembly including:
  (a) an insulative cartridge defining at least one component hole therethrough the insulative cartridge having edges and top and bottom longitudinally extending surfaces;
  (b) a metallic ground plane element juxtaposed to said insulative cartridge; and
  (c) a capacitor device located in said component hole, said capacitor device having a first polarity terminal directly connected to said elongate contact element and a second polarity terminal directly connected to said ground plane element.

26. An electrical connector comprising:
- a connector body defining a subassembly receiving area;
- at least one elongate contact element extending through said connector body;

a component subassembly located in said subassembly receiving area of said connector body, said component subassembly including:

(a) an insulative cartridge defining at least one component hole therethrough the insulative cartridge having edges and top and bottom longitudinally extending surfaces;

(b) a planar circuit board element juxtaposed to said insulative cartridge, said planar circuit board element having a patterned metallic layer thereon for providing a predetermined connection arrangement; and (c) an integrated circuit device located in said component hole, said integrated circuit device having a first terminal connected to said elongate contact element and a second terminal connected to said patterned metallic layer of said planar circuit board element.

* * * * *

UNITED STATES PATENT AND TRADEMARK OFFICE
CERTIFICATE OF CORRECTION

PATENT NO.    : 6,142,831
DATED         : November 7, 2000
INVENTOR(S)   : John J. Ashman; Brian J. Williams It is certified that error appears in the above-identified patent and that said Letters Patent is hereby corrected as shown below:

<u>Title page,</u>
Item [73], the Assignee, delete "AUX Corporation" and substitute therefor -- AVX Corporation --.

Signed and Sealed this

Twelfth Day of February, 2002

*Attest:*

JAMES E. ROGAN
*Attesting Officer*   *Director of the United States Patent and Trademark Office*